(12) United States Patent
Kim et al.

(10) Patent No.: US 11,927,880 B2
(45) Date of Patent: Mar. 12, 2024

(54) PHASE SHIFT BLANKMASK AND PHOTOMASK FOR EUV LITHOGRAPHY

(71) Applicant: S&S TECH Co., Ltd., Daegu-si (KR)

(72) Inventors: Yong-Dae Kim, Daegu-si (KR);
Chul-Kyu Yang, Daegu-si (KR);
Min-Kwang Park, Daegu-si (KR);
Mi-Kyung Woo, Daegu-si (KR)

(73) Assignee: S&S TECH Co., Ltd., Daegu-si (KR)

( * ) Notice: Subject to any disclaimer, the term of this patent is extended or adjusted under 35 U.S.C. 154(b) by 220 days.

(21) Appl. No.: 17/572,390

(22) Filed: Jan. 10, 2022

(65) Prior Publication Data

US 2022/0269160 A1    Aug. 25, 2022

(30) Foreign Application Priority Data

Feb. 25, 2021 (KR) .................. 10-2021-0025384
Jun. 15, 2021 (KR) .................. 10-2021-0077682
Jun. 15, 2021 (KR) .................. 10-2021-0077683

(51) Int. Cl.
*G03F 1/24* (2012.01)
*G03F 1/26* (2012.01)

(52) U.S. Cl.
CPC .  *G03F 1/24* (2013.01); *G03F 1/26* (2013.01)

(58) Field of Classification Search
CPC .................................... G03F 1/24; G03F 1/26
USPC ............................................................ 430/5
See application file for complete search history.

(56) References Cited

U.S. PATENT DOCUMENTS

| 11,480,867 B2 * | 10/2022 | Ikebe ...................... C23C 14/14 |
| 2021/0208498 A1 | 7/2021 | Ikebe et al. |
| 2021/0223681 A1 | 7/2021 | Ikebe et al. |
| 2021/0325772 A1 | 10/2021 | Kawahara et al. |

FOREIGN PATENT DOCUMENTS

| JP | 2010067757 A | 3/2010 |
| JP | 2020181206 A | 11/2020 |
| JP | 2021174003 A | 11/2021 |
| WO | 2019225736 A1 | 11/2019 |
| WO | 2019225737 A1 | 11/2019 |

* cited by examiner

*Primary Examiner* — Christopher G Young
(74) *Attorney, Agent, or Firm* — William Park & Associates Ltd.

(57) ABSTRACT

A blankmask for extreme ultraviolet lithography includes a substrate, a reflective layer formed on the substrate, and a phase shift layer formed on the reflective layer. The phase shift layer contains niobium (Nb), and is made of a material containing one of tantalum (Ta), chromium (Cr), and ruthenium (Ru). A phase shift layer containing Nb and Ta has a relative reflectance of 5 to 20%, a phase shift layer containing Nb and Cr has a relative reflectance of 9 to 15%, and a phase shift layer containing Nb and Ru has a relative reflectance of 20% or more. The phase shift layer has a phase shift amount of 170 to 230°, and has a surface roughness of 0.5 nmRMS or less. It is possible to obtain excellent resolution when finally manufacturing a pattern of 7 nm or less by using a photomask manufactured using such a blankmask.

38 Claims, 7 Drawing Sheets

PHASE SHIFT BLANKMASK AND PHOTOMASK FOR EUV LITHOGRAPHY

CROSS-REFERENCE TO RELATED APPLICATION

The present application claims priority under 35 U.S.C. § 119(a) to Korean patent application numbers 10-2021-0025384, filed on Feb. 25, 2021, 10-2021-0077682, filed on Jun. 15, 2021, and 10-2021-0077683, filed on Jun. 15, 2021 in the Korean Intellectual Property Office, the entire disclosure of which are incorporated herein by reference.

TECHNICAL FIELD

The present invention relates to a phase shift blankmask and a photomask, and more particularly, to a phase shift blankmask for extreme ultraviolet (EUV) lithography including phase shift layer for shifting a phase with respect to EUV exposure light, and a photomask manufactured using the same.

BACKGROUND ART

Recently, lithography technology for manufacturing semiconductor is evolving from ArF, ArFi, and multiple (MP) lithography technologies to EUV lithography technology. The EUV lithography technology is technology that is in the limelight for manufacturing semiconductor devices of 10 nm or less because the EUV lithography enables resolution improvement and process simplification by using an exposure wavelength of 13.5 nm.

Meanwhile, the EUV lithography technology may not use the existing refractive optical system such as photolithography using KrF or ArF light because EUV light is well absorbed by all materials, and a refractive index of a material at the wavelength is close to 1. For this reason, in the EUV lithography, a reflective photomask using a reflective optical system is used.

The blankmask is a raw material of the photomask, and is configured to include two thin films on a substrate to form a reflective structure: a multi-layer reflective layer reflecting EUV light and an absorbing layer absorbing EUV light. The photomask is manufactured by patterning the absorbing layer of the blankmask, and uses a principle of forming a pattern on a wafer by using the difference in contrast between a reflectance of the reflective layer and a reflectance of the absorbing layer.

Meanwhile, in recent years, there is a need to develop a blankmask for manufacturing semiconductor devices of 10 nm or less, in particular, 7 nm or 5 nm or less, and 3 nm or less in the future. However, when using a current binary photomask in a process of 5 nm or less, for example, 3 nm, there is a problem in that double patterning lithography (DPL) technology needs to be applied. Accordingly, development of a phase shift blankmask capable of realizing a higher resolution than a binary blankmask including an absorbing layer as described above is being attempted.

FIG. 1 is a diagram illustrating a basic structure of a phase shift blankmask for extreme ultraviolet lithography. The phase shift blankmask for extreme ultraviolet lithography is configured to include a substrate 102, a reflective layer 104 stacked on the substrate 102, a phase shift layer 108 formed on the reflective layer 104, and a resist layer 110 formed on the phase shift layer 108.

In the phase shift blankmask for EUV lithography as described above, the phase shift layer 108 is generally easy to manufacture a photomask, and it is preferable to use a material having excellent performance during wafer printing. For example, a tantalum (Ta)-based material may be considered as a phase shift layer material. However, since the tantalum (Ta)-based material has a relatively high refractive index (high n) and a high extinction coefficient (high k), it is difficult to implement the required reflectance and phase shift amount. Specifically, the tantalum (Ta)-based material may be generally formed to have a thickness of 55 to 65 nm to realize a phase amount of about 180°, but is difficult to have a high wafer printing effect as the phase shift layer 108 because a relative reflectance of the reflective layer 104 is less than 5%. Therefore, when the required reflectance for the phase shift layer 108 is high, the tantalum (Ta) is not suitable as a material of the phase shift layer 108.

Meanwhile, the phase shift layer 108 is preferably configured in an amorphous form in order to improve pattern fidelity during etching.

In general, the stress of the thin film is represented by total indicated reading ($\Delta$TIR). In the process of forming a pattern of a thin film, a release phenomenon of thin film stress causes a change in pattern registration. These problems occur differently depending on the pattern size and density. In order to effectively control these pattern size and density, it is necessary to make the thin film have low stress.

In addition, the phase shift layer 108 is required to have a low surface roughness. In the case of the existing binary blankmask, the reflectance to exposure light is low, and therefore, the effect of diffuse reflection due to the surface roughness is relatively insignificant, but the effect of diffuse reflection increases as the phase shift layer requires a reflectance of 5% or more. For example, when the surface roughness of the phase shift layer increases, the reflectance may be reduced due to the diffuse reflection of exposure light or the contrast may be reduced due to the flare phenomenon of reflected light, and a line edge roughness (LER) and a line width roughness (LWR) of a wafer PR pattern may deteriorate.

DISCLOSURE

Technical Problem

The present invention provides a phase shift blankmask for EUV lithography capable of satisfying high reflectance and an appropriate phase shift amount required for a phase shift layer.

In addition, the present invention provides a high-quality phase shift blankmask for EUV lithography capable of improving characteristics such as contrast, LER, and LWR during wafer printing by controlling a surface roughness of a phase shift layer.

Technical Solution

According to the present invention, a blankmask for extreme ultraviolet lithography includes a substrate, a reflective layer formed on the substrate, and a phase shift layer formed on the reflective layer, in which the phase shift layer contains niobium (Nb), and is made of a material containing one of tantalum (Ta), chromium (Cr), and ruthenium (Ru).

In a first embodiment of the present invention, the phase shift layer may contain niobium (Nb) and tantalum (Ta).

The content of tantalum (Ta) in the phase shift layer may be 30 to 70 at %.

The phase shift layer may be made of a material further containing at least one of molybdenum (Mo), ruthenium (Ru), silicon (Si), boron (B), and titanium (Ti).

The content of boron (B) in the phase shift layer may increase downward.

The phase shift layer may be made of a material further containing nitrogen (N), and a content of nitrogen (N) is 1 to 30 at %.

The content of nitrogen (N) in the phase shift layer may increase downward.

The phase shift layer may be made of a material further containing oxygen (O).

The phase shift layer may have a multi-layer structure of two or more layers. In this case, an uppermost layer of the phase shift layer may be made of a material further containing oxygen (O), and a layer under the uppermost layer may be made of a material not containing oxygen (O).

The content of oxygen in the uppermost layer may be 1 to 40 at %.

The uppermost layer may further contain nitrogen (N).

A total content of nitrogen (N) and oxygen (O) in the uppermost layer may be 1 to 40 at %.

The lower layer may further contain nitrogen (N).

The content of nitrogen (N) may be 1 to 40 at %.

The uppermost layer may have a thickness of 2 to 10 nm.

The lower layer may have a thickness of 30 to 70 nm.

A hard mask layer may be further formed on the phase shift layer. The hard mask layer may be made of chromium (Cr) or a material in which at least one of carbon (C), oxygen (O), and nitrogen (N) is added to the chromium (Cr).

The phase shift layer may be formed using a sputtering target having a composition ratio of Ta:Nb=30 to 60 at %:40 to 70 at %.

The phase shift layer may have a relative reflectance of 5 to 20% with respect to the reflective layer in extreme ultraviolet exposure light having a wavelength of 13.5 nm.

In a second embodiment of the present invention, the phase shift layer may be made of a material containing niobium (Nb) and tantalum (Ta).

The phase shift layer may be made of a material further containing nitrogen (N).

The content of nitrogen (N) in the phase shift layer may be 50 at % or less.

The phase shift layer may have a relative reflectance of 9 to 15% with respect to the reflective layer in extreme ultraviolet exposure light having a wavelength of 13.5 nm.

The phase shift layer may have a composition ratio of Cr:Nb:N=30 to 40 at %:20 to 50 at %:10 to 50 at %.

The content of Nb in the phase shift layer may be 0.6 to 2.0 times that of Cr.

The content of Nb may be equal to or higher than that of Cr so that the phase shift layer has a relative reflectance of 14 to 15%.

The content of Nb may be equal to or lower than the content of Cr so that the phase shift layer may have a relative reflectance of 9 to 10%.

The content of nitrogen (N) in the phase shift layer may increase downward.

The phase shift layer may be made of a material further containing at least one of molybdenum (Mo), tantalum (Ta), ruthenium (Ru), silicon (Si), and titanium (Ti).

The phase shift layer may further contain boron (B).

The phase shift layer may include a first layer and a second layer on the first layer. In this case, the second layer may be made of a material further containing oxygen (O).

The second layer may have a thickness of 5 nm or less.

The first layer may be configured to have a composition ratio of Cr:Nb:N=30 to 40 at %:20 to 50 at %:10 to 50 at %, and the second layer may have a content of oxygen of 1 to 50 at %.

The phase shift layer may include a first layer and a lowermost layer on the first layer, In this case, the lowermost layer is made of a material containing tantalum (Ta).

The lowermost layer may be made of a material further containing at least one of boron (B), niobium (Nb), titanium (Ti), molybdenum (Mo), and chromium (Cr).

The lowermost layer may be made of a material further containing at least one of nitrogen, carbon, and oxygen.

The lowermost layer may have a thickness of 7 nm or less.

In a third embodiment of the present invention, the phase shift layer may be made of a material containing niobium (Nb) and ruthenium (Ru).

The phase shift layer may have a content of Ru of 50 at % or more.

In the phase shift layer, a sum of the contents of Ru and Nb may be 50 at % or more.

The phase shift layer may further contain at least one of molybdenum (Mo), tantalum (Ta), silicon (Si), and titanium (Ti).

The phase shift layer may be made of a material further containing nitrogen (N).

The content of nitrogen (N) in the phase shift layer may be 50 at % or less.

The phase shift layer may further contain boron (B).

The content of boron in the phase shift layer may be 5 to 50 at %.

The phase shift layer may include a first layer and a second layer on the first layer. In this case, the first layer may be made of a material containing tantalum, and the second layer may be made of a material containing ruthenium (Ru) and niobium (Nb).

The first layer may be made of a material further containing at least one of boron (B), niobium (Nb), titanium (Ti), molybdenum (Mo), and chromium (Cr).

The first layer may be made of a material further containing at least one of nitrogen, carbon, and oxygen.

The first layer may have a content of nitrogen of 50 at % or less.

The first layer may have a content of Ta of 50 at % or more.

The first layer may have a thickness of 7 nm or less.

The phase shift layer may have a relative reflectance of 20% or more with respect to the reflective layer in extreme ultraviolet exposure light having a wavelength of 13.5 nm.

The phase shift layer may have a phase shift amount of 170 to 230°.

According to another aspect of the present invention, photomask manufactured using the blankmask for extreme ultraviolet lithography having the configuration as described above.

Advantageous Effects

According to a first embodiment of the present invention, a phase shift layer containing Nb and Ta is easy to implement a relative reflectance of 5 to 20%, and includes one layer having the same or faster etch rate in a depth direction during etching to improve a pattern profile.

According to a second embodiment of the present invention, a phase shift layer including Nb and Cr is easy to implement a relative reflectance of 9 to 15%.

According to a third embodiment of the present invention, a phase shift layer containing Nb and Ru is easy to implement a relative reflectance of 20% or more.

According to the present invention, a phase shift layer has a phase shift amount of 170 to 230°, and has a surface roughness of 0.5 nmRMS or less.

It is possible to obtain excellent resolution when finally manufacturing a pattern of 7 nm or less by using a photomask manufactured using such a blankmask.

BEST MODE

Hereinafter, the present invention will be described in more detail with reference to the drawings.

Figure 1:
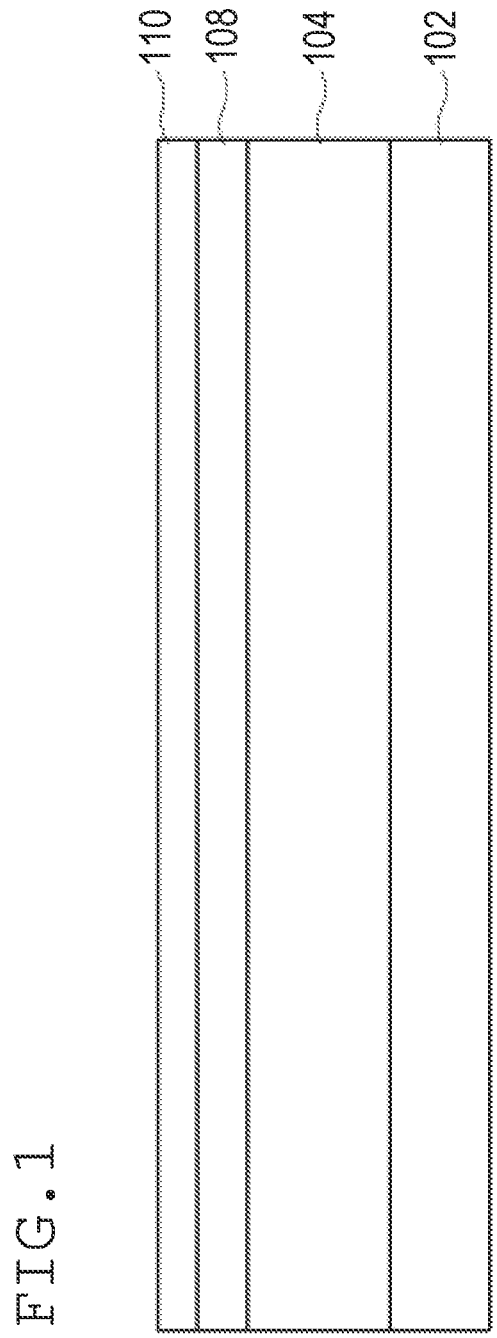
FIG. 1 is a diagram illustrating a basic structure of a conventional phase shift blankmask for extreme ultraviolet lithography.
Figure 2:
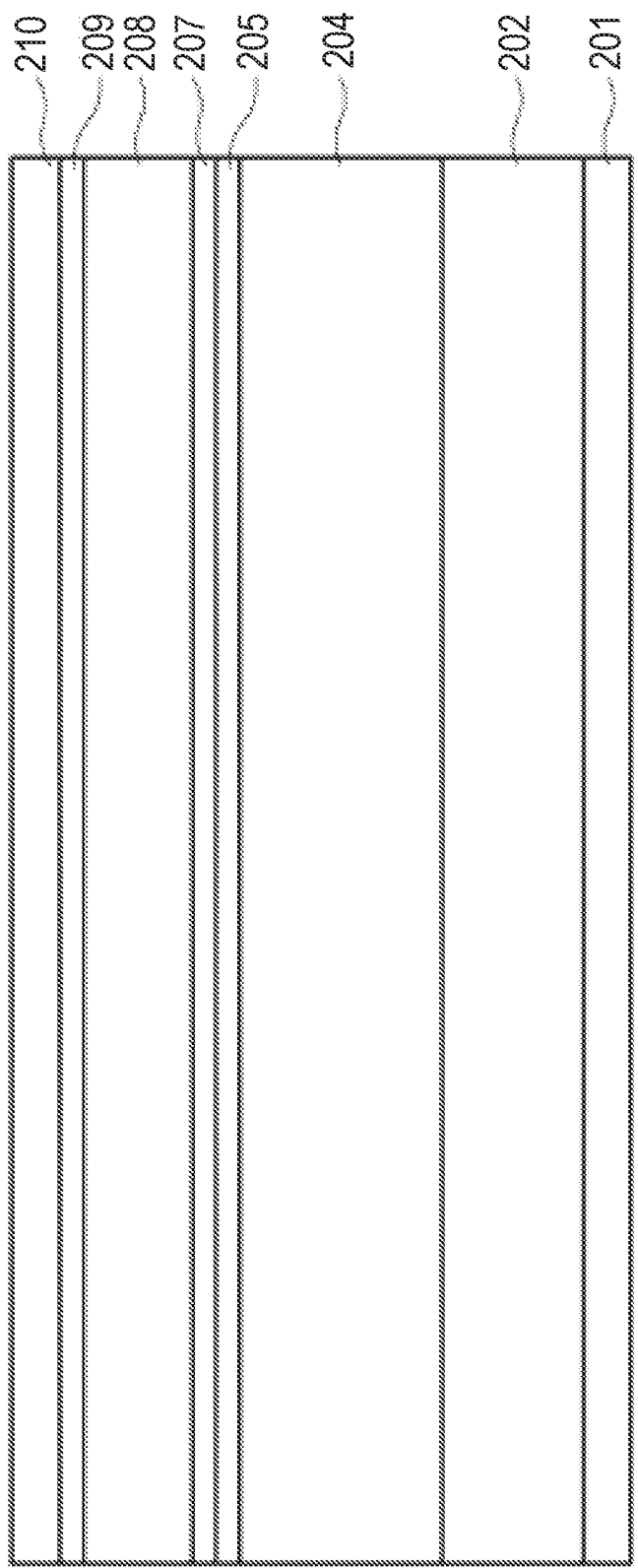
FIG. 2 is a diagram illustrating a phase shift blankmask for extreme ultraviolet lithography according to the present invention.

FIG. 2 is a diagram illustrating a phase shift blankmask for extreme ultraviolet lithography according to the present invention.

A phase shift blankmask for extreme ultraviolet lithography according to the present invention includes a substrate 202, a reflective layer 204 stacked on the substrate 202, a capping layer 205 stacked on the reflective layer 204, a phase shift layer 208 stacked on the capping layer 205, a hard mask layer 209 stacked on the phase shift layer 208, and a resist layer 210 stacked on the hard mask layer 209, and a resist layer 210 stacked on the hard mask layer 209. In addition, the blankmask according to the present invention may further include a conductive layer 201 formed on a rear surface of the substrate 202, and an etch stop layer 207 formed between the capping layer 205 and the phase shift layer 208. In addition, an absorbing layer (not illustrated) may be additionally provided between the phase shift layer 208 and the resist layer 210.

The substrate 202 is formed of a low thermal expansion material (LTEM) substrate having a low coefficient of thermal expansion of $0\pm1.0\times10^{-7}/°$ C. and preferably $0\pm0.3\times10^{-7}/°$ C. to prevent pattern deformation and stress caused by heat during exposure so that the substrate 202 is suitable as a glass substrate for a reflective blankmask using EUV exposure light. As the material of the substrate 202, $SiO_2$—$TiO_2$-based glass, multi-component-based glass ceramic, or the like may be used.

The substrate 202 requires a low level of flatness in order to control a pattern position error of reflected light during exposure. The flatness is represented by a total indicated reading (TIR) value, and the substrate 202 preferably has a low TIR value. The flatness of the substrate 202 is 100 nm or less and preferably 50 nm or less in an area of 132 $mm^2$ or an area of 142 $mm^2$.

The reflective layer 204 serves to reflect the EUV exposure light, and has a multi-layer structure having different refractive indexes of each layer. Specifically, the reflective layer 204 is formed by alternately stacking 40 to 60 layers of Mo and Si layers. An uppermost layer of the reflective layer 204 is preferably formed of a protective layer of Si to prevent oxidation of the reflective layer 204.

The reflective layer 204 requires high reflectance with respect to a wavelength of 13.5 nm in order to improve image contrast. A reflection intensity of this multi-layer reflective layer varies depending on an incident angle of exposure light and a thickness of each layer. For example, when the incident angle of the exposure light is 5 to 6°, the Mo layer and the Si layer are preferably formed to have a thickness of 2.8 nm and 4.2 nm, respectively.

The reflective layer 204 preferably has a reflectance of 60% or more and preferably 64% or more, with respect to the EUV exposure light of 13.5 nm.

When the surface flatness of the reflective layer 204 is defined as total indicated reading (TIR), the TIR has a value of 1,000 nm or less, preferably 500 nm or less, and more preferably 300 nm or less. When the surface TIR of the reflective layer 204 is high, an error occurs at a position where the EUV exposure light is reflected, and as the position error increases, a pattern position error increases.

The reflective layer 204 has a surface roughness value of 0.5 nmRms or less, preferably 0.3 nmRms or less, and more preferably 0.1 nmRms or less in order to suppress diffuse reflection with respect to the EUV exposure light.

The capping layer 205 is formed on the reflective layer 204, and prevents the formation of an oxide film of the reflective layer 204 to maintain the reflectance of the reflective layer 204 with respect to the EUV exposure light, and to prevent the reflective layer from being etched during patterning of the phase shift layer 208. As a preferred example, the capping layer 205 is made of a material containing ruthenium (Ru). The capping layer 205 is preferably formed to a thickness of 2 to 5 nm. When the thickness of the capping layer 205 is 2 nm or less, it is difficult to exhibit a function as the capping layer 205, and when the thickness of the capping layer 205 is 5 nm or more, there is a problem in that reflectance for the EUV exposure light is lowered.

The etch stop layer 207 is selectively provided between the capping layer 205 and the phase shift layer 208, and serves to protect the lower capping layer 205 during a dry etching process or a cleaning process for patterning the phase shift layer 208. The etch stop layer 207 is preferably made of a material having an etch selectivity of 10 or more with respect to the phase shift layer 208.

When the etch stop layer 207 is formed, the etch stop layer 207 is patterned together with the phase shift layer 208 on the etch stop layer 207 to serve as a part of the phase shift layer 208. In this case, the reflectance of the phase shift layer 208 means the reflectance of the entire stacked structure of the etch stop layer 207 and the phase shift layer 208.

The material forming the etch stop layer 207 is determined in consideration of the fact that the etch stop layer 207 affects the entire phase shift amount and reflectance, and also the etch selectivity of the etch stop layer 207 required for the phase shift layer 208. The etch stop layer 207 may be made of a material containing at least one of silicon (Si), molybdenum (Mo), chromium (Cr), titanium (Ti), tungsten (W), tantalum (Ta), niobium (Nb), and ruthenium (Ru), or made of a compound in which at least one of oxygen (O), nitrogen (N), carbon (C), hydrogen (H), and boron (B) is added to the material.

The etch stop layer 207 has a thickness of 0.5 to 10 nm, and preferably a thickness of 1 to 7 nm. When the etch stop layer 207 has a thickness of 10 nm or more, the reflectance of the pattern of the phase shift layer 208 finally formed is reduced, and when the etch stop layer 207 has a thickness of 0.5 nm or less, it is difficult to perform a role as the etch stop layer 207.

The phase shift layer 208 shifts a phase of the exposure light and reflects the exposure light, thereby causing destructive interference with the exposure light reflected by the reflective layer 204 to extinct the exposure light. The phase shift layer 208 is made of a material having high transmittance while facilitating phase shift control with respect to a wavelength of the exposure light. As such a material, in the present invention, a material containing niobium (Nb) and further containing at least one of tantalum (Ta), chromium (Cr), and ruthenium (Ru) is used.

In the first embodiment of the present invention, the phase shift layer 208 is made of a material containing niobium (Nb) and tantalum (Ta), which will be described in detail with reference to FIG. 3.

In the second embodiment of the present invention, the phase shift layer 208 is made of a material containing niobium (Nb) and tantalum (Ta), which will be described in detail with reference to FIGS. 4 and 6.

In the third embodiment of the present invention, the phase shift layer 208 is made of a material containing niobium (Nb) and tantalum (Ta), which will be described in detail with reference to FIGS. 6 and 7.

The first to third embodiments of the present invention will be described below in detail with reference to the respective drawings.

In order to reduce a charge-up phenomenon, the phase shift layer 208 is advantageous as a sheet resistance decreases. The phase shift layer 208 of the present invention has a sheet resistance of 1000Ω/□ or less, preferably 500Ω/□ or less, and more preferably 100Ω/□ or less.

The phase shift layer 208 preferably has a low flatness (ΔTIR) to reduce the effect of registration. The phase shift layer 208 of the present invention has a flatness of 300 nm or less, preferably 200 nm, and more preferably 100 nm or less.

The phase shift layer 208 preferably has a low surface roughness in order to prevent a flare phenomenon due to diffuse reflection on the surface and reduce intensity of reflected light. The phase shift layer 208 of the present invention has a roughness of 0.5 nmRMS or less, and preferably has a roughness of 0.3 nmRMS or less.

The phase shift layer 208 of the present invention has excellent chemical resistance during the cleaning of the photomask, and specifically, the phase shift layer 208 according to the present invention has a thickness change of 1 nm or less after SC-1 and SPM processes.

The hard mask layer 209 is optionally provided, and serves as an etch mask for patterning the phase shift layer 208 under the hard mask layer 209. The material of the hard mask layer 209 is selected to have an etch selectivity for the uppermost layer in consideration of the material of the uppermost layer of the phase shift layer 208. The hard mask layer 209 is preferably formed to have a thickness of 5 nm or less.

The resist layer 210 is formed of a chemically amplified resist (CAR). The resist layer 210 has a thickness of 40 to 100 nm, and preferably 40 to 80 nm.

The conductive layer 201 is formed on a backside of the substrate 202. The conductive layer 201 has a low sheet resistance value to serve to improve adhesion between an electronic-chuck and the blankmask for EUV, and prevent particles from being generated due to friction with the electronic-chuck. The conductive layer 201 has a sheet resistance of 100Ω/□ or less, preferably, 50Ω/□ or less, and more preferably 20Ω/□ or less.

The conductive layer 201 may be configured in the form of a single film, a continuous film, or a multi-layer film. The conductive layer 201 may be made of, for example, chromium (Cr) or tantalum (Ta) as a main component.

Hereinafter, a detailed configuration of the phase shift layer according to the first to third embodiments of the present invention will be described.

First Embodiment

In a first embodiment of the present invention, the phase shift layer 208 is configured to contain niobium (Nb) and tantalum (Ta). The phase shift layer 208 of the first embodiment has a relative reflectance of 5 to 20%.

The material containing Ta and Nb has excellent chemical resistance and has the advantage of being able to easily apply a fluorine (F)-based gas or a chlorine (Cl)-based gas which is generally used during the dry etching. In particular, Nb has a lower refractive index and extinction coefficient than Ta, so it is easy to implement a phase shift amount required for the phase shift layer 208, and it is possible to implement a relatively high reflectance. That is, the reflectance may increase by containing Nb compared to the case where only the Ta-based material is used.

Meanwhile, the phase shift layer 208 may further contain at least one of molybdenum (Mo), silicon (Si), titanium (Ti), niobium (Nb), and boron (B) in addition to Ta and Nb. In particular, when the phase shift layer 208 contains boron (B), the etch rate increases and the thin film becomes amorphous, so the pattern profile is excellent and the surface roughness is improved.

Ta and Nb determine the reflectance and phase shift amount of the phase shift layer 208. The content of Ta contained in the phase shift layer 208 is preferably 30 to 70 at %. When the content of Ta is 70 at % or more, it is difficult to implement a relative reflectance of 5% or more at a wavelength of 13.5 nm, but when the content of Ta is 30 at % or less, a side-lobe phenomenon occurs due to a high reflectance of 20% or more. More preferably, Ta has a content of 40 to 60 at %.

Meanwhile, the phase shift layer 208 is preferably formed to further contain nitrogen (N). Nitrogen (N) makes thin film crystallinity of the phase shift layer 208 amorphous to improve the pattern profile during pattern formation. In addition, nitrogen (N) has a lower atomic weight than Ta and Nb, and thus, serves to lower the surface roughness of the thin film after sputtering. As a result, it is easy to control diffuse reflection etc., occurring on the surface of the phase shift layer 208. In addition, since nitrogen (N) optically has a lower extinction coefficient (k) with respect to Ta and Nb, it is easy to implement the reflectance in the range of 5 to 20% and the phase shift amount of around 180°. However, when the content of nitrogen (N) increases, the etch rate is slowed, and thus, the pattern profile may be deteriorated. Therefore, the content of nitrogen (N) contained in the phase shift layer 208 is preferably 1 to 30 at %.

The phase shift layer 208 may further contain oxygen (O). When a layer containing Ta further contains oxygen (O), the layer has a property of being etched by a fluorine-based etching gas, and when the layer does not contain oxygen (O), the layer has a property of being etched by a chlorine-based etching gas. Therefore, when the phase shift layer 208 is formed of a multilayer of two or more layers, an uppermost layer of the phase shift layer 208 is formed of a layer containing oxygen (O), so the uppermost layer also serves as a hard mask layer. However, a separate hard mask layer 209 may be additionally formed on the phase shift layer 208 in consideration of adhesion with the resist layer 210 on the phase shift layer 208.

In addition, when the uppermost layer of the phase shift layer 208 contains oxygen (O), it has the advantage of improving inspection contrast for inspection equipment using an ultraviolet area. However, since there is no inspection contrast problem in the case of performing inspection using an e-beam or inspection equipment using a wavelength of 13.5 nm, the uppermost layer does not need to contain oxygen (O).

Meanwhile, the phase shift layer 208 may also be formed by further containing at least one of carbon (C) and hydrogen (H).

The sputtering target for forming the phase shift layer 208 has a composition ratio of Ta:Nb=30 to 60 at %:40 to 70 at %. In addition, when containing boron (B) as a sputtering target of the phase shift layer 208, the content of boron (B) has a range of 0 to 30 at %. When the content of B is 30 at % or more, defects may occur in the phase shift layer 208.

The phase shift layer 208 has a relative reflectance of 5 to 20% in extreme ultraviolet exposure light having a wavelength of 13.5 nm. Here, the relative reflectance means the reflectance of the phase shift layer 208 with respect to the reflectance of the reflective layer 204.

The phase shift layer 208 has a phase shift amount of 170 to 230°, and preferably has a phase shift amount that maximizes the effect of NILS during wafer printing. In general, since the NILS varies depending on pattern density, pattern profile (line & space, contact pattern), and the like, the phase shift layer 208 has a phase shift amount of 170 to 230°, and preferably 180 to 220° for effective implementation of the NILS.

The phase shift layer 208 is designed in a single-layer or multi-layer structure, and in the case of the single-layer structure, the phase shift layer 208 may be designed so that the etch rate is the same, faster, or slower in the depth direction of the phase shift layer 208, that is, downward in the drawing. Preferably, a phenomenon such as footing may be prevented by designing the etch rate to be faster in the depth direction. To this end, the phase shift layer 208 may be implemented in the form of a single-layer continuous film or a multi-layer continuous film, and may be formed by mixing thee single-layer continuous film or the multi-layer film.

Specifically, when the phase shift layer 208 is formed of TaNbN (lower layer) and TaNbNO (uppermost layer), TaNbN of the lower layer may increase the etch rate in the depth direction by continuously decreasing the content of nitrogen (N) in the depth direction during film formation. In addition, since the etch rate increases when boron (B) is contained in the TaNbN material, the etch rate may increase in the depth direction by continuously increasing the content of boron (B) in the depth direction.

As another method, when the phase shift layer 208 is formed in a multi-layer structure of TaNbN, the etch rate of the lowermost layer may increase by decreasing the content of nitrogen (N) or increasing the content of boron (B) in the lowermost layer content compared to the upper layer. It is possible to control the etch rate through a combination of various methods, including the method exemplified above. As a result, the pattern profile of the phase shift layer 208 finally formed may be improved.

The phase shift layer 208 preferably has a small thickness in order to reduce the shadowing effect. The phase shift layer 208 has a thickness of 30 to 70 nm, and preferably a thickness of 40 to 60 nm.

The hard mask layer 209 is made of a material having an etch selectivity for the phase shift layer 208. As described above, when the uppermost layer of the phase shift layer 208 is made of a material containing oxygen (O), for example, TaNbON, since TaNbON has a property of being etched by the fluorine-based etching gas, the uppermost layer of the phase shift layer 208 may serve as a hard mask for a layer under the uppermost layer. However, since TaNbON may cause an adhesion problem with the upper resist layer 210, the hard mask layer 209 made of a material that is etched by a chlorine-based etching gas, for example, a material containing chromium (Cr) may be further formed on the phase shift layer 208 having the structure. Preferably, the hard mask layer 209 may be made of a material further containing at least one of carbon (C), oxygen (O), and nitrogen (N), that is, any one of Cr, CrC, CrO, CrN, CrCO, CrON, CrCN, and CrCON. The hard mask layer 209 has a thickness of 2 to 10 nm.

Meanwhile, when using e-beam inspection and 13.5 nm inspection as described above, since the phase shift layer 208 does not need to contain oxygen (O), the phase shift layer 208 may be made of TaNbN. In this case, since the phase shift layer 208 is etched by the chlorine-based etching gas, the hard mask layer 209 may be made of a material etched by the fluorine-based etching gas. For example, the hard mask layer 209 may be made of a Si-based material or a material in which at least one of C, O, and N are additionally added to Si, and specifically, the hard mask layer 209 may be made of any one of Si, SiC, SiO, SiN, SiCO, SiCN, SiON, and SiCON.

After preparing a chromium (Cr) target to form the hard mask layer on the phase shift layer, a CrCON thin film was formed to have a thickness of 4 nm under conditions of $Ar:N_2:CO_2$=5 sccm:5 sccm:5 sccm, and process power of 0.6 kW.

Thereafter, a conductive layer containing chromium (Cr) as a main component was formed on a backside of an LTEM substrate using a DC magnetron reactive sputtering facility. The conductive layer was formed to have a thickness of 36 nm in a single-layer structure of a CrN thin film. At this time, as a result of measuring a sheet resistance of the conductive layer using a 4-point probe, it was confirmed that there was no problem in E-chucking with an electrostatic chuck by indicating a sheet resistance value of 26Ω/□, and the surface roughness measured in an area of 1 μm×1 μm using AFM equipment showed 0.4 nm RMS.

Thereafter, the blankmask was manufactured by forming a chemically amplified resist layer to a thickness of 80 nm.

Implementation Example 2. Increase in TaNbN Etch Rate (Decrease in Content of N)

In Implementation Example 2, the content of nitrogen in the TaNbN lower layer decreased in order to increase the etch rate when the phase shift layer was patterned. Specifically, the TaNbN lower layer was formed to have a thickness of 5 nm under the conditions of $Ar:N_2$=9:0.5 sccm.

In Implementation Example 1, the etch rate of 12 Å/s was shown, but in Implementation Example 2, as the content of nitrogen in the lower layer decreases, the etch rate of 14.2 Å/s was shown, so it was confirmed that the etch rate increased.

Implementation Example 3. Evaluation of Etch Rate According to Increase in Content of B In Implementation Example 3, the boron (B) was included in the TaNbN lower layer decreased in order to increase the etch rate when the phase shift layer was patterned.

First, using a Ta:Nb:B=45:45:10 at % target, the layer was formed in the same manner as in Example 1 under the condition of Ar:N2=9:1.5 sccm. In this case, as a result of measuring the etch rate, the etch rate was 15.2 Å/s in Implementation Example 3 with respect to 12 Å/s in Implementation Example 1.

Thereafter, the blankmask was manufactured by using the chemically amplified resist layer with a thickness of 80 nm.

Second Embodiment

In a second embodiment of the present invention, a phase shift layer 208 is configured to include niobium (Nb) and chromium (Cr). The phase shift layer 208 of the first embodiment has a relative reflectance of 9 to 15%.

Nb has a lower extinction coefficient (k) than Cr and Ta, so it is easy to implement the phase shift layer 208 having a high reflectance. That is, the reflectance may increase by using Nb together compared to the case of using only the Cr-based material or only the Ta-based material. In addition, since Nb has a lower refractive index than Ta, it is easy to implement a phase shift amount required for the phase shift layer 208.

Meanwhile, the phase shift layer 208 is preferably formed to further contain nitrogen (N). As the phase shift layer 208 made of CrNb further contains nitrogen (N), an extinction coefficient (k) and a refractive index (n) may be further lowered. As a result, it is possible to reduce the thickness and to easily control the phase shift amount. In addition, by including nitrogen (N), there is an advantage in that a pattern profile may be improved by improving the etch rate. In addition, nitrogen (N) makes thin film crystallinity of the phase shift layer 208 amorphous to improve a pattern profile during pattern formation. In addition, nitrogen (N) has a lower atomic weight than Cr and Nb, and thus, serves to lower a surface roughness of the thin film after sputtering. As a result, it is easy to control diffuse reflection etc., occurring on the surface of the phase shift layer 208. However, when the content of nitrogen (N) increases, since the phase shift layer 208 is deteriorated by cleaning solutions such as SPM, SC-1, and TMAH used when cleaning the phase shift layer 208, the content of nitrogen is preferably 50 at % or less, and more preferably 10 to 40 at %.

Meanwhile, the phase shift layer 208 is made of a material further containing at least one of molybdenum (Mo), tantalum (Ta), ruthenium (Ru), silicon (Si), and titanium (Ti). As a result, it is possible to fine-tune the extinction coefficient (k) and the refractive index (n), and thus, it is possible to implement the phase shift layer 208 having a relative reflectance of 9 to 15% and a desired phase shift amount.

In addition, the phase shift layer 208 may further include boron (B). When the phase shift layer 208 contains boron (B), the etch rate increases and the thin film becomes amorphous, so the pattern profile is excellent and the surface roughness is improved.

The phase shift layer 208 preferably has a thickness of 50 nm or less. In the case of having a thickness of 50 nm or more, the precision of the final pattern manufactured using the photomask is deteriorated due to the shadowing effect. In addition, the phase shift layer 208 may be formed in a single-layer structure, a continuous film structure, or a multi-layer structure of two or more layers.

When the phase shift layer 208 is configured in a multi-layer structure of two or more layers, the uppermost layer of the phase shift layer 208 may be configured as a layer containing oxygen (O). When the uppermost layer of the phase shift layer 208 contains oxygen (O), there is an advantage in that inspection contrast for inspection light of an ArF wavelength of 193 nm is improved. However, since there is no inspection contrast problem in the case of performing inspection using an e-beam or inspection equipment using a wavelength of 13.5 nm, the uppermost layer does not need to contain oxygen (O).

The hard mask layer 209 serves as an etch mask for patterning the phase shift layer 208 under the hard mask layer 209. To this end, the hard mask layer 209 is made of a material having an etch selectivity for the phase shift layer 208. When the phase shift layer 208 contains Cr and Nb, the phase shift layer 208 has a property of being etched by a chlorine (Cl)-based etching material. Therefore, the hard mask layer 209 is preferably made of a material etched by a fluorine (F)-based etching material. As an example, the hard mask layer 209 may be made of a Si-based material or a material in which at least one of C, O, and N are additionally added to Si, and specifically, the hard mask layer 209 may be made of any one of Si, SiC, SiO, SiN, SiCO, SiCN, SiON, and SiCON. Preferably, the hard mask layer 209 is made of SiON. The hard mask layer 209 is preferably formed to have a thickness of 5 nm or less.

Figure 4:
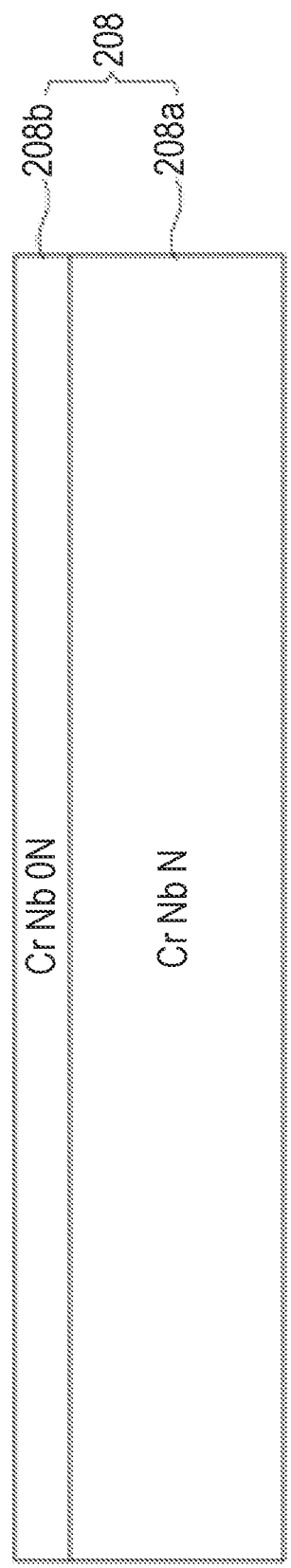
FIG. 4 is a diagram illustrating a second embodiment of a detailed configuration of the phase shift layer of FIG. 2.

FIG. 4 is a diagram illustrating a specific configuration of a second embodiment of the present invention.

Figure 3:
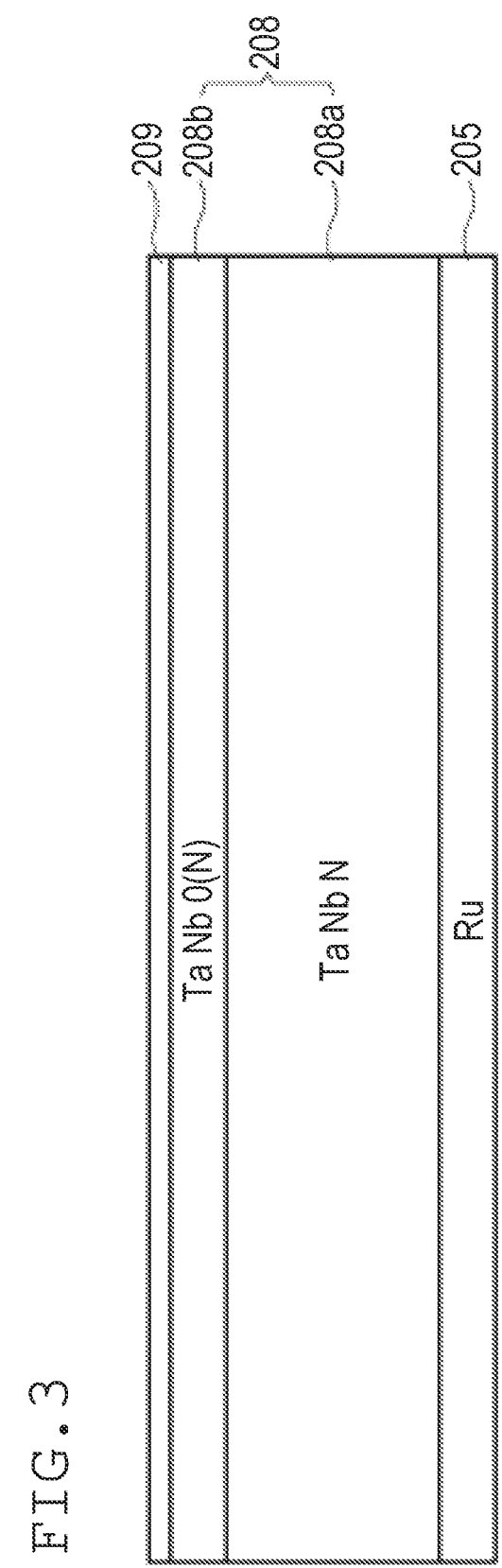
FIG. 3 is a diagram illustrating a first embodiment of a detailed configuration of the phase shift layer of FIG. 2.

The constituent material of each layer of the phase shift layer 208 of FIG. 4 is different from the first embodiment of FIG. 3, but the same reference numerals as in FIG. 3 are assigned to each layer of FIG. 4 for convenience of illustration and description. Specifically, reference numeral 208a is assigned to a lower layer of the phase shift layer 208 having a two-layer structure, and reference numeral 208b is assigned to an upper layer. In the following other examples and modifications, the same reference numerals are given.

The phase shift layer 208 in FIG. 4 has a relative reflectance of 9 to 15%. In addition, the phase shift layer 208 has a phase shift amount of 170 to 230°, and has a phase shift amount of, for example, 177 to 185° that maximizes the effect of NILS during wafer printing.

In the present embodiment, the phase shift layer 208 is formed in a two-layer structure, the lower first layer 208a is made of CrNbN, and the upper second layer 208b is made of CrNbON. As described above, when the phase shift layer 208 contains oxygen (O), the inspection contrast for a 193 nm ArF wavelength increases, so the second layer 208a serves as an inspection layer.

A second layer 208b is formed to have a minimum thickness capable of serving as an inspection layer, and preferably has a thickness of 5 nm or less in consideration of this. The first layer 208a is a main layer that controls the reflectance and the phase shift amount, and occupies most of the entire thickness of the phase shift layer 208, and has a thickness of 40 to 50 nm, and preferably 44 to 46 nm. The phase shift layer 208 is preferably configured to be 50 nm or less in total thickness.

A composition ratio of each constituent material of the phase shift layer 208 is set to implement a relative reflectance of 9 to 15% and a phase shift amount of 170 to 230°.

Specifically, the phase shift layer 208 is configured to have a composition ratio of Cr:Nb:N=30 to 40 at %:20 to 50 at %:10 to 50 at %. In this case, the content of Nb is preferably configured to be 0.6 to 2.0 times that of Cr. In this case, it is preferable that the content of Nb is equal to or higher than that of Cr to implement a relative reflectance of 14 to 15%, and it is preferable that the content of Nb is lower than that of Cr to implement a relative reflectance of 9 to 10%. Meanwhile, when the content of nitrogen is 10 at % or less, the effect on the improvement in the etch rate and extinction coefficient and refractive index is insignificant, and when the content of nitrogen is 50 at % or more, a phenomenon of deterioration by the cleaning solution appears. Therefore, nitrogen preferably contains 10 to 50 at %.

When the phase shift layer 208 is configured to have a two-layer structure as illustrated in FIG. 3, the first layer 208a is configured to have a composition ratio of Cr:Nb: N=30 to 40 at %:20 to 50 at %:10 to 50 at %, and the second layer 208b is configured to have the content of oxygen of 1 to 50 at % and preferably 1 to 30 at %. When the content of oxygen is 1 at % or less, the decrease in reflectance at a wavelength of 193 nm is insignificant, so it is difficult to improve inspection contrast. When the content of oxygen is 50 at % or more, it is difficult to secure reproducibility when forming a thin film. In addition, repair fail is caused by spontaneous reaction due to a difference in an extent of e-Repair between a part made of CrNbON and a part made of CrNbN during e-repair.

The entire phase shift layer 208 or the first layer 208a of the phase shift layer 208 may be configured so that the etch rate is the same, faster, or slower in the depth direction, that is, downward in the drawing. Preferably, a phenomenon such as footing may be prevented by configuring the etch rate to be faster in the depth direction. To this end, for example, the first layer 208a of the phase shift layer 208 may be implemented in the form of a single-layer continuous film or a multi-layer film, or may be formed by mixing the single-layer continuous film or the multi-layer film. Specifically, the first layer 208a of the phase shift layer 208 may increase the etch rate in the depth direction by continuously increasing the content of nitrogen (N) in the depth direction during film formation. As a result, the pattern profile of the phase shift layer 208 finally formed may be improved.

Figure 5:
FIG. 5 is a diagram illustrating a modification of FIG. 4.

FIG. 5 is a diagram illustrating a modification of FIG. 4.

Figure 7:
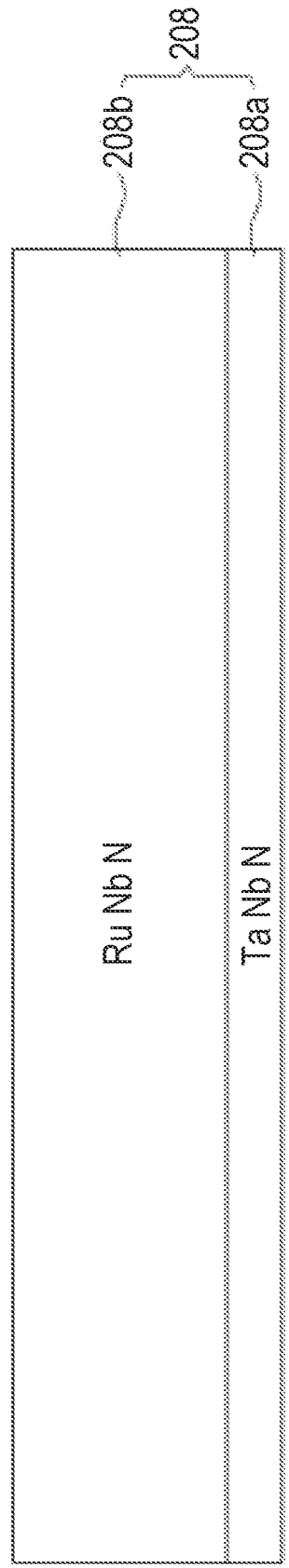
FIG. 7 is a diagram illustrating a modification of FIG. 6.

Overlapping descriptions of contents corresponding to the configuration of FIG. 7 in the contents described with respect to FIG. 4 are omitted, but these contents are equally applied to FIG. 5.

A phase shift layer 208 of this modification also has a relative reflectance of 9 to 15% and a phase shift amount of 170 to 230°.

In this modification, the phase shift layer 208 is formed in a two-layer structure, and includes a first layer 208a made of CrNbN, and a lowermost layer 208c formed under the first layer 208a. The configuration of the first layer 208a is substantially the same as that of the first layer 208a of FIG. 3.

The lowermost layer 208c serves to prevent oxidation of Ru of the capping layer 205 by an etching gas used when the first layer 208a is etched. The layer made of a CrNb compound etched in the chlorine (Cl)-based gas is etched using oxygen (O) gas to facilitate etching. For this reason, the CrNb layer may be over-etched, and the capping layer 205 reacts with oxygen to cause a problem in that the reflectance of the reflective layer 204 is rapidly reduced. Accordingly, in order to solve this problem, the lowermost layer 208c is preferably made of a material that is etched by an oxygen-free gas. To this end, the lowermost layer 208c is preferably made of a material containing tantalum (Ta). For example, the lowermost layer 208c may be made of tantalum (Ta) alone, a material in which at least one of tantalum (Ta), boron (B), niobium (Nb), titanium (Ti), molybdenum (Mo), and chromium (Cr) is additionally contained in the Ta, or a material in which at least one of nitrogen, carbon, and oxygen is contained in the material. As an example, the lowermost layer 208c may be made of one of Ta, TaN, TaC, TaO, TaON, TaCO, TaCN, and TaCON. Preferably, the lowermost layer 208c is made of TaBN as illustrated in FIG. 4. As another example, the lowermost layer 208c may be made of TaNbN.

The lowermost layer 208c also functions to control the reflectance and the phase shift amount of the entire phase shift layer 208. To this end, various combinations of the composition, composition ratio, thickness, etc., of the materials constituting the lowermost layer 208c are possible. Specifically, in order to improve the reflectance, the lowermost layer 208c is configured to have a thickness of 5 nm or less, or a thickness of 7 nm, and may additionally include niobium (Nb) and/or boron (B) to lower the extinction coefficient (k).

In this case, a lowermost layer 208c is configured so that the content of tantalum (Ta) is 50 at % or more. As a result, the etch rate is improved during final patterning, which is advantageous in forming the pattern profile, and damage to the pattern profile of the upper first layer 208a is minimized.

Meanwhile, the lowermost layer 208c may be formed in a two-layer structure including a lower layer made of Ta and an upper layer made of TaO.

The first layer 208-2 has a thickness of 30 to 40 nm, and preferably a thickness of 35 to 37 nm. The lowermost layer 208c has a minimum thickness required for reflectance control, and preferably has a thickness of 7 nm or less.

Third Embodiment

In a third embodiment of the present invention, a phase shift layer 208 is configured to include niobium (Nb) and ruthenium (Ru). The phase shift layer 208 of the third embodiment has a relative reflectance of 20% or more.

The material containing Ru and Cr has excellent chemical resistance and has the advantage of being able to apply fluorine (F)-based and chlorine (Cl)-based gases, which are generally used during the dry etching. In particular, a material containing Ru and Nb may be easily etched by the chlorine-based gas.

Ru and Nb have a lower extinction coefficient (k) than Ta, so it is easy to implement the phase shift layer 208 having a high transmittance and reflectance. As Ru and Nb have a lower extinction coefficient (k) and a lower refractive index (n) than Ta, Ru, and Nb have high transmittance with respect to a wavelength of 13.5 nm. Accordingly, it is possible to implement a relatively high reflectance because a loss of reflectance finally generated from the reflective layer 204 is low. In addition, the low refractive index of the phase shift layer 208 enables the implementation of a low thickness of the phase shift layer 204 to finally reduce the 3D effect.

The content of Ru included in the phase shift layer 208 is at least 50 at % or more, and preferably 70 at % or more, and the sum of the contents of Ru and Nb is preferably 50-100 at %. Since the composition ratios of Ru and Nb determine the reflectance of the phase shift layer 208, the ratio of Ru and Nb contained in the phase shift layer 208 is determined in consideration of the required reflectance. Since Ru and Nb have a lower extinction coefficient than Ta and Cr, the reflectance of the phase shift layer 208 may increase.

Since Ru has a lower refractive index than Nb, the phase shift amount required for the phase shift layer 208 may be implemented by adjusting the composition ratios of Ru and Nb. In order for the phase shift layer 208 to have a relative reflectance of 20% or more, the content of Ru in RuNb is preferably 50 at % or more.

The phase shift layer 208 may further include at least one of molybdenum (Mo), tantalum (Ta), silicon (Si), and titanium (Ti) in addition to Ru and Nb. As a result, it is possible to implement a phase shift layer having a reflectance of 15 to 30%. Specifically, Ru can implement a reflectance of 30%, but is difficult to implement a reflectance of 20%, and Mo can implement a reflectance of 40%, but is difficult to implement a reflectance of 20%. Accordingly, a thin film having a reflectance of 20 to 30% can be manufactured through a combination of a material having a high reflectance and a material having a low reflectance.

The phase shift layer 208 is preferably formed to contain nitrogen (N). Nitrogen (N) makes thin film crystallinity of the phase shift layer 208 amorphous to improve the pattern profile during pattern formation. In addition, nitrogen (N) has a lower atomic weight than Ru and Nb, and thus, serves to lower a surface roughness of the thin film after sputtering. As a result, it is easy to control diffuse reflection etc., occurring on the surface of the phase shift layer 208. In addition, when the phase shift layer 208 contains nitrogen (N), an edge roughness of the pattern in the photomask finally patterned with the phase shift layer is improved. However, when the content of nitrogen is high, the density of the thin film decreases, and finally, there is a problem in that it is difficult to implement a predetermined reflectance and it is difficult to secure the required phase shift amount. Accordingly, the content of nitrogen needs to be appropriately controlled according to the reflectance target to be implemented, and preferably 50 at % or less.

The phase shift layer 208 may further contain boron (B). When the phase shift layer contains boron (B), the etch rate increases and the thin film becomes amorphous, so the pattern profile is excellent and the surface roughness is improved. In addition, boron (B) serves to lower the surface roughness of the thin film after sputtering as the boron (B) has a lower atomic weight than Ru and Nb. As a result, it is easy to control diffuse reflection etc., occurring on the surface of the phase shift layer 208. On the other hand, when the content of boron (B) is high, the boron (B) tends to be relatively vulnerable to a cleaning solution during the cleaning process. Therefore, the content of boron (B) contained in the phase shift layer 208 is preferably 5 to 50 at %.

The phase shift layer 208 preferably has a thickness of 50 nm or less. In the case of having a thickness of 50 nm or more, the precision of the final pattern manufactured using the photomask is deteriorated due to the shadowing effect. In addition, the phase shift layer 208 may be formed in a single-layer structure, a continuous film structure, or a multi-layer structure of two or more layers.

The hard mask layer 209 serves as an etch mask for patterning the phase shift layer 208 under the hard mask layer 209. To this end, the hard mask layer 209 is made of a material having an etch selectivity for the phase shift layer 208. When the phase shift layer 208 contains Ru and Nb, the phase shift layer 208 has a property of being etched by a chlorine (Cl)-based etching material. Therefore, the hard mask layer 209 is preferably made of a material etched by a fluorine (F)-based etching material. For example, the hard mask layer 209 may be made of a Si-based material or a material in which at least one of C, O, and N are additionally added to Si, and specifically, the hard mask layer 209 may be made of any one of Si, SiC, SiO, SiN, SiCO, SiCN, SiON, and SiCON. Preferably, the hard mask layer 209 is made of SiON. The hard mask layer 209 is preferably formed to have a thickness of 5 nm or less.

Figure 6:
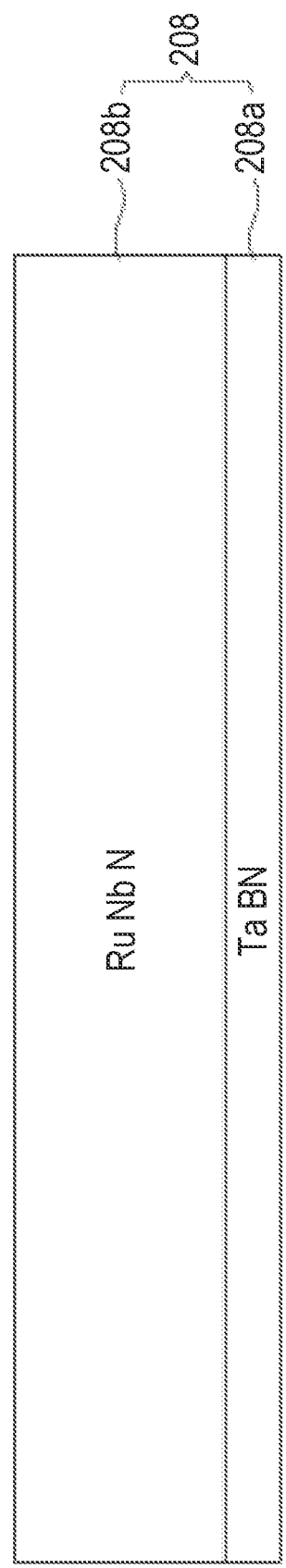
FIG. 6 is a diagram illustrating a third embodiment of a detailed configuration of the phase shift layer of FIG. 2.

FIG. 6 is a diagram illustrating a specific configuration of a third embodiment of the present invention.

The phase shift layer 208 of the present embodiment has a relative reflectance of 20% or more. In addition, the phase shift layer 208 has a phase shift amount of 170 to 230°, and preferably has a phase shift amount of, for example, 180 to 185° that maximizes the effect of NILS during wafer printing.

In this embodiment, the phase shift layer 208 has a two-layer structure of a first layer 208a and a second layer 208b. As described above, the second layer 208b is made of a material containing RuNb, and the first layer 208a is made of a material containing tantalum (Ta).

The first layer 208a serves to prevent damage to the lower capping layer 205 when the second layer 208b is etched. That is, since the material of the capping layer 205 under the first layer 208a is Ru and Ru is contained in the RuNb material of the second layer 208b, when the first layer 208a does not exist, the capping layer 205 may be etched when the second layer 208b of the phase shift layer 208 is etched. However, since the first layer 208a is made of a material having an etch selectivity for the second layer 208b and the capping layer 205, the first layer 208a serves as an etch stop layer. In this case, a separate etch stop layer 207 illustrated in FIG. 2 is unnecessary. Preferably, the first layer 208a is made of a material having an etch selectivity of 10 or more with respect to the second layer 208b and the capping layer 205. The first layer 208a has a minimum thickness required to perform the function of the etch stop layer, and preferably has a thickness of 7 nm or less.

The first layer 208a is made of tantalum (Ta) alone, or may be made of a material in which at least one of boron (B), niobium (Nb), titanium (Ti), molybdenum (Mo), and chromium (Cr) is additionally added to the tantalum (Ta). Furthermore, the first layer 208a may be made of a material in which at least one of nitrogen, carbon, and oxygen is added to the material. As an example, when the first layer 208a is made of a single compound of tantalum (Ta), the first layer 208a may be made of one of Ta, TaN, TaC, TaO, TaON, TaCO, TaCN, and TaCON.

In addition, the first layer 208a serves to control the reflectance and the phase shift amount of the entire phase shift layer 208 together with the second layer 208b. To this end, the first layer 208a and the second layer 208a may have various combinations of compositions, composition ratios, and thicknesses. Specifically, in order to increase the entire reflectance of the phase shift layer 208, the thickness of the first layer 208a is controlled to 7 nm or less or 5 nm or less, or in order to decrease the entire extinction coefficient (k) of the phase shift layer 208, the first layer 208-1 may be configured to further contain boron (B). Preferably, the first layer 208a is made of TaBN as illustrated in FIG. 6. When containing boron (B), the phase shift layer 208 is easily controlled to have a relative reflectance of 20% or more.

The first layer 208a is preferably configured to contain 50 at % or more of Ta. When Ta is 50 at % or less, there is a problem that the etch selectivity for the second layer 208b and the capping layer 205 is lowered, and that the etch rate is relatively slow, and thus, it is difficult to form an excellent pattern profile. When nitrogen (N) is contained in the first layer 208a, the content of nitrogen is preferably 50 at % or less. When nitrogen is added to tantalum (Ta), the etch rate is slowed, so the upper second layer 208b is damaged when the first layer 208a is etched. Accordingly, the first layer 208-1 contains 50 at % or less of nitrogen, so the damage to the second layer 208-2 may be prevented.

Meanwhile, the first layer 208a may be formed of a single layer or a multilayer. As an example, the first layer 208a may be formed in a two-layer structure of a lower layer made of Ta and an upper layer made of TaO.

In the etching process of the first layer 208a, it is preferable to use an oxygen-free etching gas in order to minimize the optical loss of the lower capping layer 205 or the upper second layer 208a.

The composition of the second layer 208b is the same as that of the phase shift layer 208 containing Ru and Nb. The second layer 208b has a thickness of 25 to 40 nm, and preferably a thickness of 30 to 40 nm. The phase shift layer 208 is preferably configured to be 55 nm or less in total thickness. The second layer 208b may be formed of a single layer or a multilayer of two or more layers.

FIG. 7 is a diagram illustrating a modification of FIG. 6.

Overlapping descriptions of contents corresponding to the configuration of FIG. 7 in the contents described with respect to FIG. 6 are omitted, but these contents are equally applied to FIG. 7.

The phase shift layer 208 of the present modification has a relative reflectance of 20% or more. In addition, the phase shift layer 208 has a phase shift amount of 170 to 230°, and preferably has a phase shift amount of, for example, 180 to 195° that maximizes the effect of NILS during wafer printing.

Compared with the embodiment of FIG. 6 and the modification of FIG. 6, the material of the first layer 208a is different. That is, in the embodiment of FIG. 7, the first layer 208a is made of TaNbN. Since Nb has a lower extinction coefficient (k) than Ta, when Nb is added to Ta, the reflectance of the first layer 208a may increase. Accordingly, by controlling the contents of Ta and Nb, it is possible to control the degree of control of the reflectance by the first layer 208a. Specifically, the higher the content of Nb, the higher the reflectance of the first layer 208a. As a result, the reflectance of the entire phase shift layer 208 increases, and thus, it is easy to implement a high relative reflectance of 20% or more.

The first layer 208a has a minimum thickness required to perform the function of the etch stop layer, and preferably has a thickness of 7 nm or less. The second layer 208b has a thickness of 25 to 40 nm, and preferably a thickness of 30 to 32 nm.

The composition of the second layer 208b is the same as that of the phase shift layer 208 containing Ru and Nb. The first layer 208a has a content of Nb of 1 to 50 at %, preferably 5 to 50 at %, and more preferably 10 to 40 at %, so the reflectance of the entire phase shift layer 208 may be 20% or more.

Hereinabove, the present invention has been specifically described through examples of the present invention with reference to the drawings, but the embodiments are only used for the purpose of illustrating and explaining the present invention and are not used to limit the meaning or the scope of the present invention described in the claims. Therefore, those having ordinary skill in the technical field of the disclosure can understand that various modifications and equivalent other embodiments are possible from the embodiments. Accordingly, an actual technical scope of the present invention is to be determined by the spirit of the appended claims.

The invention claimed is:

1. A blankmask for extreme ultraviolet lithography, comprising:
   a substrate;
   a reflective layer formed on the substrate; and
   a phase shift layer formed on the reflective layer,
   wherein the phase shift layer contains niobium (Nb) and tantalum (Ta),
   wherein a content of tantalum (Ta) in the phase shift layer is 30 to 70 at %, and
   wherein the phase shift layer has a relative reflectance of greater than 5% and lower than 20% with respect to the reflective layer in extreme ultraviolet exposure light having a wavelength of 13.5 nm.

2. The blankmask for extreme ultraviolet lithography of claim 1,
   wherein the phase shift layer is made of a material further containing at least one of molybdenum (Mo), ruthenium (Ru), silicon (Si), boron (B), and titanium (Ti).

3. The blankmask for extreme ultraviolet lithography of claim 2,
   wherein a content of boron (B) in the phase shift layer increases downward.

4. The blankmask for extreme ultraviolet lithography of claim 1,
   wherein the phase shift layer is made of a material further containing nitrogen (N), and a content of nitrogen (N) is 1 to 30 at %.

5. The blankmask for extreme ultraviolet lithography of claim 4,
   wherein the content of nitrogen (N) in the phase shift layer increases downward.

6. The blankmask for extreme ultraviolet lithography of claim 1,
   wherein the phase shift layer is made of a material further containing oxygen (O).

7. The blankmask for extreme ultraviolet lithography of claim 1,
   wherein the phase shift layer has a multi-layer structure of two or more layers, and
   wherein an uppermost layer of the phase shift layer is made of a material further containing oxygen (O), a content of oxygen (O) is 1 to 40 at %, and a layer under the uppermost layer is made of a material not containing oxygen (O).

8. The blankmask for extreme ultraviolet lithography of claim 7,
   wherein the uppermost layer further contains nitrogen (N).

9. The blankmask for extreme ultraviolet lithography of claim 8,
   wherein a total content of nitrogen (N) and oxygen (O) in the uppermost layer is 1 to 40 at %.

10. The blankmask for extreme ultraviolet lithography of claim 8,
    wherein the lower layer further contains nitrogen (N), and a content of nitrogen (N) is 1 to 40 at %.

11. The blankmask for extreme ultraviolet lithography of claim 7,
    wherein the uppermost layer has a thickness of 2 to 10 nm.

12. The blankmask for extreme ultraviolet lithography of claim 11,
    wherein the lower layer has a thickness of 30 to 70 nm.

13. The blankmask for extreme ultraviolet lithography of claim 1,
    wherein the phase shift layer has a phase shift amount of 170 to 230°.

14. A photomask manufactured using the blankmask for extreme ultraviolet lithography of claim 1.

15. A blankmask for extreme ultraviolet lithography, comprising:
a substrate;
a reflective layer formed on the substrate; and
a phase shift layer formed on the reflective layer,
wherein the phase shift layer contains niobium (Nb), chrome (Cr), and nitrogen (N),
wherein the phase shift layer has a relative reflectance of 9 to 15% with respect to the reflective layer in extreme ultraviolet exposure light having a wavelength of 13.5 nm,
wherein the phase shift layer includes a first layer and a second layer on the first layer,
wherein the first layer is configured to have a constitution ratio of Cr:Nb:N=30 to 40 at %:20 to 50 at %:10 to 50 at % and
wherein the second layer is made of a material further containing oxygen (O) of 1 to 50 at %, and has a thickness of 5 nm or less.

16. The blankmask for extreme ultraviolet lithography of claim 15,
wherein a content of Nb in the phase shift layer is 0.6 to 2.0 times that of Cr.

17. The blankmask for extreme ultraviolet lithography of claim 16,
wherein the phase shift layer has a relative reflectance of 14 to 15%, and the content of Nb is equal to or higher than that of Cr.

18. The blankmask for extreme ultraviolet lithography of claim 16,
wherein the phase shift layer has a relative reflectance of 9 to 10%, and the content of Nb is equal to or lower than the content of Cr.

19. The blankmask for extreme ultraviolet lithography of claim 15,
wherein the content of nitrogen (N) in the phase shift layer increases downward.

20. The blankmask for extreme ultraviolet lithography of claim 15,
wherein the phase shift layer is made of a material further containing at least one of molybdenum (Mo), tantalum (Ta), ruthenium (Ru), silicon (Si), and titanium (Ti).

21. The blankmask for extreme ultraviolet lithography of claim 15,
wherein the phase shift layer further contains boron (B).

22. The blankmask for extreme ultraviolet lithography of claim 15,
wherein the phase shift layer includes a first layer and a lowermost layer on the first layer, and
wherein the lowermost layer is made of a material containing tantalum (Ta).

23. The blankmask for extreme ultraviolet lithography of claim 22,
wherein the lowermost layer is made of a material further containing at least one of boron (B), niobium (Nb), titanium (Ti), molybdenum (Mo), and chromium (Cr).

24. The blankmask for extreme ultraviolet lithography of claim 22,
wherein the lowermost layer is made of a material further containing at least one of nitrogen, carbon, and oxygen, and has a thickness of 7 nm or less.

25. The blankmask for extreme ultraviolet lithography of claim 15,
wherein the phase shift layer has a phase shift amount of 170 to 230°.

26. A photomask manufactured using the blankmask for extreme ultraviolet lithography of claim 15.

27. A blankmask for extreme ultraviolet lithography, comprising:
a substrate;
a reflective layer formed on the substrate; and
a phase shift layer formed on the reflective layer,
wherein the phase shift layer contains niobium (Nb) and ruthenium (Ru),
wherein the phase shift layer has a content of Ru of 50 at % or more,
wherein the phase shift layer has a relative reflectance greater than 20% with respect to the reflective layer in extreme ultraviolet exposure light having a wavelength of 13.5 nm.

28. The blankmask for extreme ultraviolet lithography of claim 1,
wherein the phase shift layer further contains at least one of molybdenum (Mo), tantalum (Ta), silicon (Si), and titanium (Ti).

29. The blankmask for extreme ultraviolet lithography of claim 1,
wherein the phase shift layer is made of a material further containing nitrogen (N), and a content of nitrogen (N) is 50 at % or less.

30. The blankmask for extreme ultraviolet lithography of claim 1,
wherein the phase shift layer further contains boron (B), and a content of boron is 5 to 50 at %.

31. The blankmask for extreme ultraviolet lithography of claim 1,
wherein the phase shift layer includes a first layer and a second layer on the first layer,
wherein the first layer is made of a material containing tantalum, and
wherein the second layer is made of a material containing ruthenium (Ru) and niobium (Nb).

32. The blankmask for extreme ultraviolet lithography of claim 31,
wherein the first layer is made of a material further containing at least one of boron (B), niobium (Nb), titanium (Ti), molybdenum (Mo), and chromium (Cr).

33. The blankmask for extreme ultraviolet lithography of claim 31,
wherein the first layer is made of a material further containing at least one of nitrogen, carbon, and oxygen.

34. The blankmask for extreme ultraviolet lithography of claim 33,
wherein the first layer has a content of nitrogen of 50 at % or less.

35. The blankmask for extreme ultraviolet lithography of claim 31,
wherein the first layer has a content of Ta of 50 at % or more.

36. The blankmask for extreme ultraviolet lithography of claim 31,
wherein the first layer has a thickness of 7 nm or less.

37. The blankmask for extreme ultraviolet lithography of claim 27,
wherein the phase shift layer has a phase shift amount of 170 to 230°.

38. A photomask manufactured using the blankmask for extreme ultraviolet lithography of claim 27.

* * * * *